(12) United States Patent
Ahn et al.

(10) Patent No.: US 12,720,696 B2
(45) Date of Patent: Aug. 25, 2026

(54) DISPLAY DEVICE AND METHOD OF MANUFACTURING THE SAME

(71) Applicant: Samsung Display Co., Ltd., Yongin-Si (KR)

(72) Inventors: Hung Kun Ahn, Yongin-si (KR); Young Do Kim, Yongin-si (KR); Han Sun Ryou, Yongin-si (KR); Jung Hyun Oh, Yongin-si (KR); Byung Seo Yoon, Yongin-si (KR); Myung Ki Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 91 days.

(21) Appl. No.: 18/766,069

(22) Filed: Jul. 8, 2024

(65) Prior Publication Data

US 2025/0220837 A1 Jul. 3, 2025

(30) Foreign Application Priority Data

Jan. 2, 2024 (KR) ........................ 10-2024-0000269

(51) Int. Cl.
*H05K 5/03* (2006.01)

(52) U.S. Cl.
CPC ..................................... *H05K 5/03* (2013.01)

(58) Field of Classification Search
None
See application file for complete search history.

(56) References Cited

U.S. PATENT DOCUMENTS

| | | | | |
|---|---|---|---|---|
| 9,983,424 | B2 | 5/2018 | Kim et al. | |
| 11,300,996 | B2 * | 4/2022 | Kim | H04M 1/0268 |
| 11,442,202 | B2 | 9/2022 | Park et al. | |
| 11,839,137 | B2 | 12/2023 | Yee | |
| 2016/0357052 | A1 * | 12/2016 | Kim | H10K 59/87 |
| 2019/0344535 | A1 * | 11/2019 | Sugamata | B32B 27/306 |
| 2021/0104694 | A1 * | 4/2021 | Yee | G06F 1/1616 |
| 2021/0141124 | A1 * | 5/2021 | Park | G02B 1/14 |
| 2021/0286407 | A1 * | 9/2021 | Kim | H04M 1/0268 |
| 2022/0147107 | A1 * | 5/2022 | Wang | G06F 1/1616 |
| 2022/0310977 | A1 * | 9/2022 | Kim | G02B 5/3083 |

FOREIGN PATENT DOCUMENTS

| | | | | |
|---|---|---|---|---|
| KR | 20120109257 | A * | 10/2012 | H01M 50/454 |
| KR | 10-20210042206 | A | 4/2021 | |
| KR | 20220168598 | A * | 12/2022 | G06F 1/1652 |
| KR | 20220168601 | A * | 12/2022 | G06F 1/1652 |
| KR | 10-20230006670 | A | 1/2023 | |
| KR | 10-2506631 | B1 | 3/2023 | |

OTHER PUBLICATIONS

Mukherjee, A. K. et al., "A new ethylene poly—linear low density polyethylene (LLDPE)", Popular Plastics, vol. 15, Oct. 1985, 9 pages.

* cited by examiner

*Primary Examiner* — Kenneth Bukowski

(74) *Attorney, Agent, or Firm* — Innovation Counsel LLP

(57) ABSTRACT

A display device has unfoldable areas and a foldable area between the unfoldable areas. The display device includes a display module and a plate that supports the display module under the display module. The plate defines opening patterns overlapping the foldable area. A first adhesive layer is between the display module and the plate and overlaps at least the unfoldable areas, and a polyolefin-based resin fills the opening patterns.

15 Claims, 14 Drawing Sheets

DM: BL1, BRL, BL2, PSA2, PFL, PSA3, PNL, PSA4, DL
WD: UTG, PSA6, PL, HCAF

SCL: ML
DM: BL1, BRL, BL2, PSA2, PFL, PSA3, PNL, PSA4, DL
WD: UTG, PSA6, PL, HCAF

SCL: ML, CVL
DM: BL1, BRL, BL2, PSA2, PFL, PSA3, PNL, PSA4, DL
WD: UTG, PSA6, PL, HCAF

DM': PFL', PSA2', PNL'
WD': UTG', PSA4', PL', HCAF'

DM': PFL', PSA2', PNL'
WD': UTG', PSA4', PL', HCAF'

SCL': ML', CVL'
DM': PFL', PSA2', PNL'
WD': UTG', PSA4', PL', HCAF'

DISPLAY DEVICE AND METHOD OF MANUFACTURING THE SAME

CROSS-REFERENCE TO RELATED APPLICATION

The present application claims priority under 35 U.S.C. § 119(a) to Korean patent application No. 10-2024-0000269 filed on Jan. 2, 2024 in the Korean Intellectual Property Office, the entire disclosure of which is incorporated herein by reference.

BACKGROUND

Technical Field

The present disclosure generally relates to a display device and a method of manufacturing the same.

Related Art

Foldable display devices, unlike rigid display devices, may be bendable, foldable, or rollable. Accordingly, the foldable display devices can be easily carried in compact configurations and may be more convenient for users. However, as a foldable display device is repeatedly used, creases may be generated in an area (e.g., a foldable area), and the shape of the foldable display device may be deformed. The creases or deformation may cause deterioration of the visibility of images on the display device and may detract from the appearance of the display device.

SUMMARY

Embodiments disclosed herein include a display device having improved visibility and a method of manufacturing the display device.

In accordance with an aspect of the present disclosure, a display device may include unfoldable areas and a foldable area disposed between the unfoldable areas. The display device may particularly include: a display module; a plate supporting the display module under the display module, the plate defining a plurality of opening patterns overlapping with the foldable area; a first adhesive layer interposed between the display module and the plate; and a polyolefin-based resin filling the plurality of opening patterns.

A melting point of the polyolefin-based resin may be 100° C. or higher and 180° C. or lower.

The polyolefin-based resin may be a linear low density polyethylene (LLDPE) resin including a repeating unit derived from ethylene and a repeating unit derived from C3 to C8 alpha-olefin.

The first adhesive layer may overlap the unfoldable areas and may not overlap the foldable area.

The display device may further include a step difference compensation layer disposed on the plate in the foldable area to cover the polyolefin-based resin filling the plurality of opening patterns.

The step difference compensation layer may include a metal layer and a cover layer disposed on the metal layer.

The display module may include: a protective film layer; a panel layer disposed on the protective film layer, the panel layer including a plurality of pixels; and a second adhesive layer interposed between the protective film layer and the panel layer.

The first adhesive layer may be in direct contact with each of the protective film layer and the plate in the unfoldable area.

A thickness of the display module may be 80 μm or more and 120 μm or less.

In accordance with another aspect of the present disclosure, a display device has unfoldable areas and a foldable area disposed between the unfoldable areas. The display device may include a display module; a plate supporting the display module under the display module, the plate defining a plurality of opening patterns overlapping with the foldable area; a first adhesive layer interposed between the display module and the plate; and a polyolefin-based resin filling the plurality of opening patterns. The first adhesive layer may overlap the unfoldable areas and the foldable area.

A melting point of the polyolefin-based resin may be 100° C. or higher and 180° C. or lower.

The polyolefin-based resin may be a linear low density polyethylene (LLDPE) resin including a repeating unit derived from ethylene and a repeating unit derived from C3 to C8 alpha-olefin.

The display module may include: a protective film layer; a panel layer disposed on the protective film layer, the panel layer including a plurality of pixels; and a second adhesive layer interposed between the protective film layer and the panel layer.

The first adhesive layer may be in direct contact with each of the protective film layer and the plate in the unfoldable area and the foldable area.

A thickness of the display module may be 80 μm or more and 120 μm or less.

In accordance with another aspect of the present disclosure, a method may manufacture a display device including unfoldable areas and a foldable area disposed between the unfoldable areas. The method may include: filling a polyolefin-based resin in a plurality of opening patterns defined in a plate to overlap with the foldable area; and attaching the plate to a display module by allowing a first adhesive layer interposed therebetween. The filling may include pressing together the plate and a structure including the polyolefin-based resin and a step difference compensation layer disposed on the polyolefin-based resin, and the pressing may use a pair of pressurizing plates.

During the pressing, the structure may not overlap with the unfoldable area and may overlap with the foldable area.

The method may further include removing the step difference compensation layer after pressing together the plate and the structure.

A melting point of the polyolefin-based resin may be 100° C. or higher and 180° C. or lower.

The pressing may be performed at a temperature equal to or higher than the melting point of the polyolefin-based resin.

The polyolefin-based resin may be a linear low density polyethylene (LLDPE) resin including a repeating unit derived from ethylene and a repeating unit derived from C3 to C8 alpha-olefin.

BRIEF DESCRIPTION OF THE DRAWINGS

Example embodiments are described more fully hereinafter with reference to the accompanying drawings. In the drawing figures, dimensions may be exaggerated or otherwise altered for clarity of illustration. Like reference numerals refer to like elements throughout.

DETAILED DESCRIPTION

Figure 1:
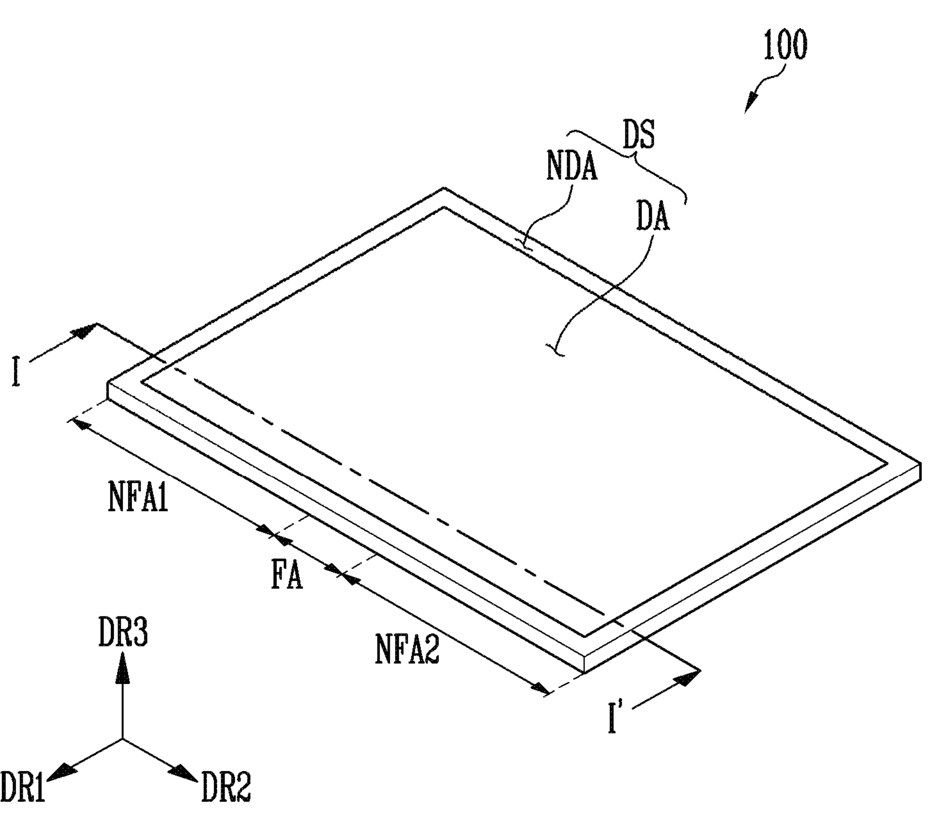
FIGS. 1 and 2 are perspective views respectively illustrating a flat configuration and a folded configuration of a display device in accordance with embodiments of the present disclosure.

Hereinafter, example embodiments of the present disclosure will be described in more detail with reference to the accompanying drawings. The description below focuses on parts and features that are necessary to understand subject matter in accordance with the present disclosure, and descriptions of other parts or features may be omitted to avoid unnecessarily obscuring subject matters of the present disclosure. In addition, the present disclosure is not limited to example embodiments described herein but may be embodied in various different forms. Rather, the example embodiments are described herein to convey the aspects of the disclosure to a person of ordinary skill in the art.

In the entire specification, an element referred to as being "connected" or "coupled" to another element may be directly connected or coupled to the other element or may be indirectly connected or coupled to the other element with one or more intervening elements interposed therebetween. An element referred to as being "between" two elements may be the only element between the two elements, or one or more intervening elements may also be present. When a component "includes" an element, it should be understood that the component does not exclude another element but may further include another element, unless expressly stated otherwise herein. For the purposes of this disclosure, "at least one of X, Y, and Z" should be construed as X only, Y only, Z only, or any combination of two or more items X, Y, and Z (e.g., XYZ, XYY, YZ, ZZ). Similarly, for the purposes of this disclosure, "at least one selected from the group consisting of X, Y, and Z" should be construed as X only, Y only, Z only, or any combination of two or more items X, Y, and Z (e.g., XYZ, XYY, YZ, ZZ).

It will be understood that, although the terms "first", "second," etc. may be used herein to describe various elements, these elements should not be limited by these terms. These terms are only used to distinguish one element from another element. Thus, a "first" element discussed below could also be termed a "second" element without departing from the teachings of the present disclosure.

Spatially relative terms, such as "below," "above," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

In addition, embodiments of the disclosure may be described here with reference to schematic diagrams of ideal embodiments (and an intermediate structure) of the present disclosure, so that changes in a shape as shown due to, for example, manufacturing technology and/or a tolerance may be expected. Therefore, the embodiments of the present disclosure shall not be limited to the specific shapes of a region shown here, but include shape deviations caused by, for example, the manufacturing technology. The regions and features shown in the drawings are schematic in nature. For example, the shapes shown in the drawings may not represent the actual shapes of the regions of the device, and the drawings are not intended to limit the scope of the disclosure to the illustrated shapes.

Figure 2:
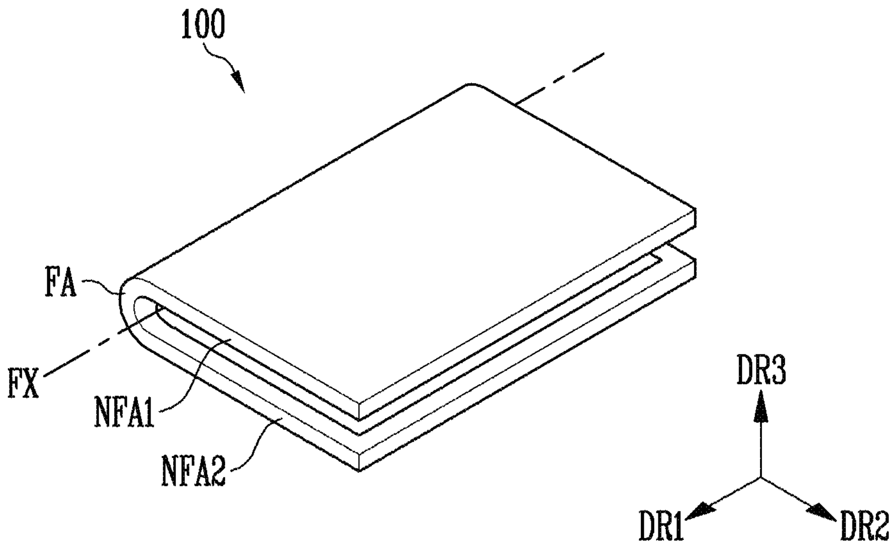

FIGS. 1 and 2 are perspective views illustrating a display device in accordance with an embodiment of the present disclosure. FIG. 1 is a perspective view illustrating the display device in an unfolded state. FIG. 2 is a perspective view illustrating the display device in a folded state.

Referring to FIGS. 1 and 2, the display device 100 may have a display surface DS. As shown in FIG. 1, the display surface may be in a plane defined by a first direction DR1 and a second direction DR2 when the display device 100 is in an unfolded state.

The display surface DS may include a display area DA and a non-display area NDA at the periphery of the display area DA. The display area DA is an area in which the display device 100 may display an image, and the non-display area NDA may be an area in which the image is not displayed.

In the embodiment of FIG. 1, the display area DA may have a quadrangular shape. The non-display area NDA may surround at least a portion of the display area DA. However, the display area DA and the non-display area NDA are not limited to the illustrated shapes, and the shape of each of the display area DA and the non-display area NDA may be variously modified.

The display device 100 may include a first unfoldable area NFA1, a foldable area FA, and a second unfoldable area NFA2, which are sequentially defined (or arranged) along the second direction DR2 or the direction opposite the second direction DR2. For example, the foldable area FA may be disposed between the first unfoldable area NFA1 and the second unfoldable area NFA2. Although FIGS. 1 and 2 show an example including one foldable area FA and two unfoldable areas NFA1 and NFA2, embodiments are not limited thereto. For example, the display device 100 may include more than two unfoldable areas with foldable areas disposed between adjacent unfoldable areas.

The display device 100 may be folded about a folding axis FX. As a result, the foldable area FA may be bent about the folding axis FX. In the example where the unfoldable areas NFA1 and NFA2 are arranged along the second direction DR2, the folding axis FX may extend in the first direction DR1.

The display surface DS of display device 100 may be folded inwardly with respect to the folding axis FX. When the display device 100 is folded as shown in FIG. 2, a display surface of the first unfoldable area NFA1 and a display surface of the second unfoldable area NFA2 may face each other. However, the display device 100 of the present disclosure is not limited thereto. For example, the display device 100 may be folded outwardly with respect to the folding axis FX. When the display device 100 is folded outwardly, the display surface of the first unfoldable area NFA1 and the display surface of the second unfoldable area NFA2 may face in directions opposite to each other.

Figure 3:
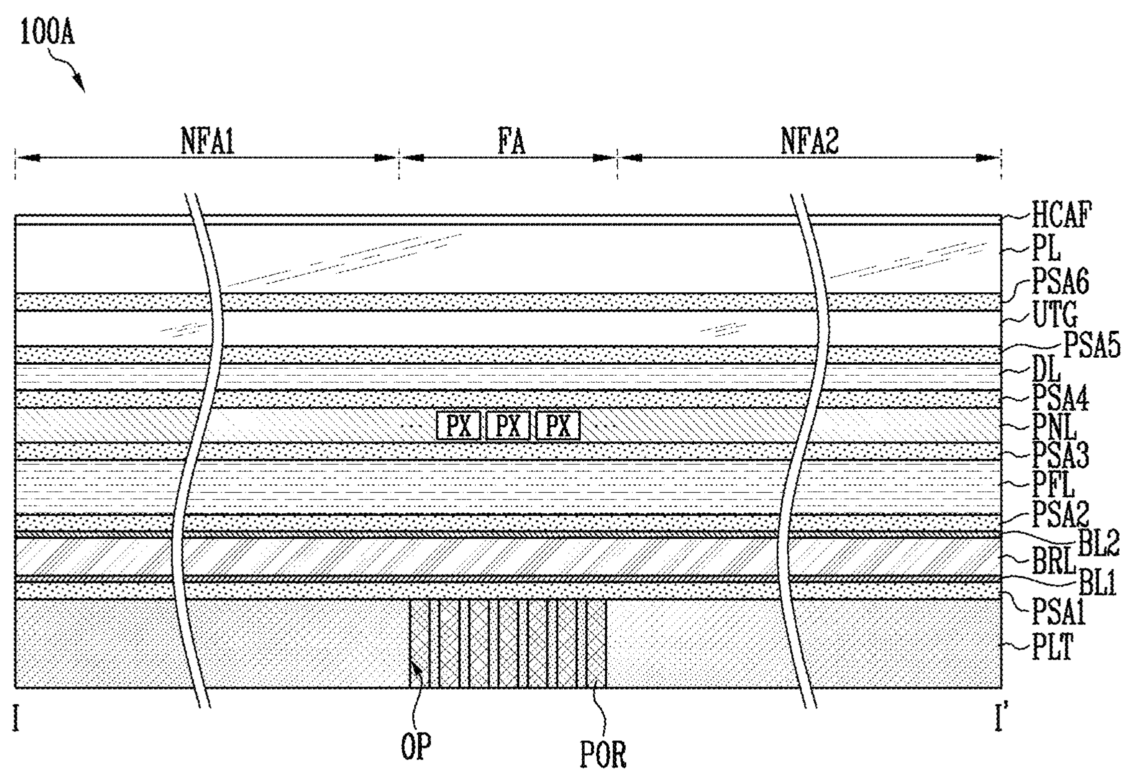
FIG. 3 is a sectional view taken along line I-I' in accordance with a first embodiment of the display device shown in FIG. 1.

FIG. 3 is a sectional view taken along line I-I' in accordance with a first embodiment of the display device shown in FIG. 1.

Referring to FIG. 3, a display device 100A in accordance with the first embodiment of the present disclosure may include a plate PLT, a first adhesive layer PSA1, a first black primer coating layer BL1, a barrier layer BRL, a second black primer coating layer BL2, a second adhesive layer PSA2, a protective film layer PFL, a third adhesive layer PSA3, a panel layer PNL, a fourth adhesive layer PSA4, a functional layer DL, a fifth adhesive layer PSA5, a glass layer UTG, a sixth adhesive layer PSA6, a first protective layer PL, and a second protective layer HCAF.

The first black primer coating layer BL1, the barrier layer BRL, the second black primer coating layer BL2, the second adhesive layer PSA2, the protective film layer PFL, the third adhesive layer PSA3, the panel layer PNL, the fourth adhesive layer PSA4, and the functional layer DL may define a display module DM, and the glass layer UTG, the sixth adhesive layer PSA6, the first protective layer PL, and the second protective layer HCAF may define a window WD.

The plate PLT may include a material having a relatively high hardness. Accordingly, the plate PLT may function to support various components disposed on the plate PLT. For example, the plate PLT under the display module DM may function to support the display module DM.

In an embodiment, a plurality of opening patterns OP in the plate PLT may overlap the foldable area FA. Accordingly, the plate PLT may be more flexible in the foldable area FA.

The first adhesive layer PSA1 may be interposed between the plate PLT and the display module DM. For example, the first adhesive layer PSA1 may be interposed between the plate PLT and the first black primer coating layer BL1 as shown in FIG. 3. The first adhesive layer PSA1 may function to allow the plate PLT and the display module DM to adhere to each other.

In an embodiment, the first adhesive layer PSA1 may be in direct contact with each of the plate PLT and the display module DM. For example, as shown in FIG. 3, the first adhesive layer PSA1 may be in direct contact with each of the plate PLT and the first black primer coating layer BL1. In an embodiment in which the first black primer coating layer BL1 is omitted as described below, the first adhesive layer PSA1 may be in direct contact with the plate PLT and the barrier layer BRL.

The first black primer coating layer BL1, the barrier layer BRL, and the second black primer coating layer BL2 may be sequentially disposed on the first adhesive layer PSA1. In an embodiment, the first black primer coating layer BL1 and the second block primer coating layer BL2 may include a black primer coated on a top surface and a bottom surface of the barrier layer BRL.

Each of the first black primer coating layer BL1 and the second block primer coating layer BL2 may function to improve black visibility in the display device 100A. For example, when the display device 100A does not display any image, the first black primer coating layer BL1 and the second block primer coating layer BL2 may cause the display area DA to appear black.

In an alternative embodiment, at least one of the first black primer coating layer BL1 and the second block primer coating layer BL2 may be omitted.

The barrier layer BRL may function to absorb and reduce impact from a bottom surface of the display device 100A. In an embodiment, the barrier layer BRL may include an organic insulating material. The barrier layer BRL may be designated as a cushion layer.

The protective film layer PFL may be disposed on the second black primer coating layer BL2, and the second adhesive layer PSA2 may be interposed between the second black primer coating layer BL2 and the protective film layer PFL.

The protective film layer PFL may be under the panel layer PNL and may function to absorb and reduce impact from the bottom of the panel layer PNL. Also, the protective film layer PFL may function to block an impurity infiltrating toward a bottom surface of the panel layer PNL.

The second adhesive layer PSA2 may function to allow the second black primer coating layer BL2 and the protective film layer PFL to adhere to each other. In an embodiment, the second adhesive layer PSA2 may be in direct contact with each of the second black primer coating layer BL2 and the protective film layer PFL.

The panel layer PNL may be disposed on the protective film layer PFL, and the third adhesive layer PSA3 may be interposed between the protective film layer PFL and the panel layer PNL.

The panel layer PNL may include a plurality of pixels PX. Each of the pixels PX may emit light, and the display device 100A may display an image formed by a combination of the light emitted from the plurality of pixels PX.

The third adhesive layer PSA3 may function to allow the protective film layer PFL and the panel layer PNL to adhere to each other. In an embodiment, the third adhesive layer PSA3 may be in direct contact with each of the protective film layer PFL and the panel layer PNL.

The functional layer DL may be disposed on the panel layer PNL, and the fourth adhesive layer PSA4 may be interposed between the panel layer PNL and the functional layer DL.

The functional layer DL may include one layer or a plurality of layers. For example, the functional layer DL may be a film layer which substantially performs the same function as the protective film layer PFL. In another example, the functional layer DL may be a polarizing layer which prevents external light incident from outside of the display device 100A from being reflected and then viewed by a user. In still another example, the functional layer DL may have a stacked structure of the film layer and the polarizing layer. In an embodiment, the functional layer DL may be omitted. The fourth adhesive layer PSA4 disposed to allow the panel layer PNL and the functional layer DL to adhere to each other, but the fourth adhesive layer PSA4 may be omitted in some embodiments.

The glass layer UTG may be disposed on the functional layer DL, and the fifth adhesive layer PSA5 may be interposed between the glass layer UTG and the functional layer DL.

The glass layer UTG may include a material having a relatively high light transmittance and a relatively high hardness. Also, the glass layer UTG may be flexible. For example, the glass layer UTG may include an ultra-thin reinforcing glass.

The fifth adhesive layer PSA5 may function to allow the functional layer DL and the glass layer UTG to adhere to each other. In an embodiment, the fifth adhesive layer PSA5 may be in direct contact with each of the functional layer DL and the glass layer UTG.

The first protective layer PL may be disposed on the glass layer UTG, and the sixth adhesive layer PSA6 may be interposed between the glass layer UTG and the first protective layer PL.

The first protective layer PL may have a relatively high light transmittance and may include a material having a sufficient hardness to protect the underlying structure. Also, the first protective layer PL may be flexible. For example, the first protective layer PL may include polyethylene terephthalate (PET). The first protective layer PL along with the glass layer UTG may perform a function of protecting the display device 100A from external impact.

The sixth adhesive layer PSA6 may function to allow the glass layer UTG and the first protective layer PL to adhere to each other. In an embodiment, the sixth adhesive layer PSA6 may be in direct contact with each of the glass layer UTG and the first protective layer PL.

The second protective layer HCAF may be disposed on the first protective layer PL. In an embodiment, the second protective layer HCAF may be a coating layer coated on the first protective layer PL. The second protective layer HCAF may prevent or resist formation of a trace (e.g., a fingerprint or the like) caused by a touch of a user.

In the above-described display device 100A in accordance with the first embodiment of the present disclosure, a polyolefin-based resin POR may fill the plurality of opening patterns OP defined in the plate PLT. The polyolefin-based resin POR may function to improve the reliability of the plate PLT in the foldable area FA. Specifically, if the polyolefin-based resin POR were omitted, the plate PLT may sag in a direction opposite to a third direction DR3 in the foldable area FA after repeated shape deformations in or folding of the foldable area FA. The repeated folding causes sagging of the display module DM in the foldable area FA, which is a problem in that creases may be generated. In the example of FIG. 3, the polyolefin-based resin POR filling the plurality of opening patterns OP can minimize sagging of the plate PLT in the foldable area FA.

In an embodiment, a melting point of the polyolefin-based resin POR may be about 100° C. or higher and about 180° C. or lower, preferably, about 130° C. or higher and about 150° C. or lower. When the melting point of the polyolefin-based resin POR is in the above-described temperature ranges, the reliability of the polyolefin-based resin POR can be maintained even though operation of the display device 100 may increase the temperature of the display device 100A. In addition, the temperature required in a process of forming the polyolefin-based resin POR, which is described below, can be relatively low, and thus manufacturing efficiency can be improved.

In an embodiment, the polyolefin-based resin POR may be a linear low density polyethylene (LLDPE) resin including a repeating unit derived from ethylene and a repeating unit derived from C3 to C8 alpha-olefin. More specifically, the linear low density polyethylene (LLDPE) resin may be made of polymer having a main chain including a repeating unit derived from ethylene and a repeating unit derived from C3 to C8 alpha-olefin and a C2 to C6, preferably, C2 to C3 side chain, and have a density of about 0.915 g/cm$^3$ or more and about 0.935 g/cm$^3$ or less. The linear low density polyethylene (LLDPE) resin may have a relatively low density compared to a high density polyethylene (HDPE) resins (density: about 0.94 g/cm$^3$ or more and about 0.966 g/cm$^3$ or less), and the linear low density polyethylene (LLDPE) resin may have a more linear molecular structure than low density polyethylene (LDPE) resins (resins made of polymer having a cross-linking structure and/or a C7 or more side chain). Meanwhile, various kinds of resins previously known in the art may be used as the linear low density polyethylene (LLDPE) resin without limitation. The linear low density polyethylene (LLDPE) resin has tensile strength, elongation, impact strength, moisture-proof performance, heat resistance, and stress resistance, which are excellent as compare with the high density polyethylene (HDPE) resins and low density polyethylene (LDPE) resins. Thus, when the linear low density polyethylene (LLDPE) resin is used as the polyolefin-based resin POR, the reliability of the polyolefin-based resin POR can be sufficiently ensured in spite of the repetitive shape deformation in the foldable area FA.

In an embodiment, the first adhesive layer PSA1 may overlap with the first unfoldable area NFA1 and the second unfoldable area NFA2. Also, the first adhesive layer PSA1 may overlap with the foldable area FA. That is, the first adhesive layer PSA1 may entirely cover the first unfoldable area NFA1, the foldable area FA, and the second unfoldable area NFA2.

The first adhesive layer PSA1 may cover the polyolefin-based resin POR, which fills the plurality of opening patterns OP defined in the foldable area FA. That is, there may be no empty space between the plate PLT and the display module DM in the foldable area FA. Accordingly, support of the display module DM in the foldable area FA may be sufficient to prevent or minimize the generation of creases in the foldable area FA (or an area adjacent thereto) in spite of repetitive shape deformation that folding and unfolding of the display device 100A may cause.

Figure 4:
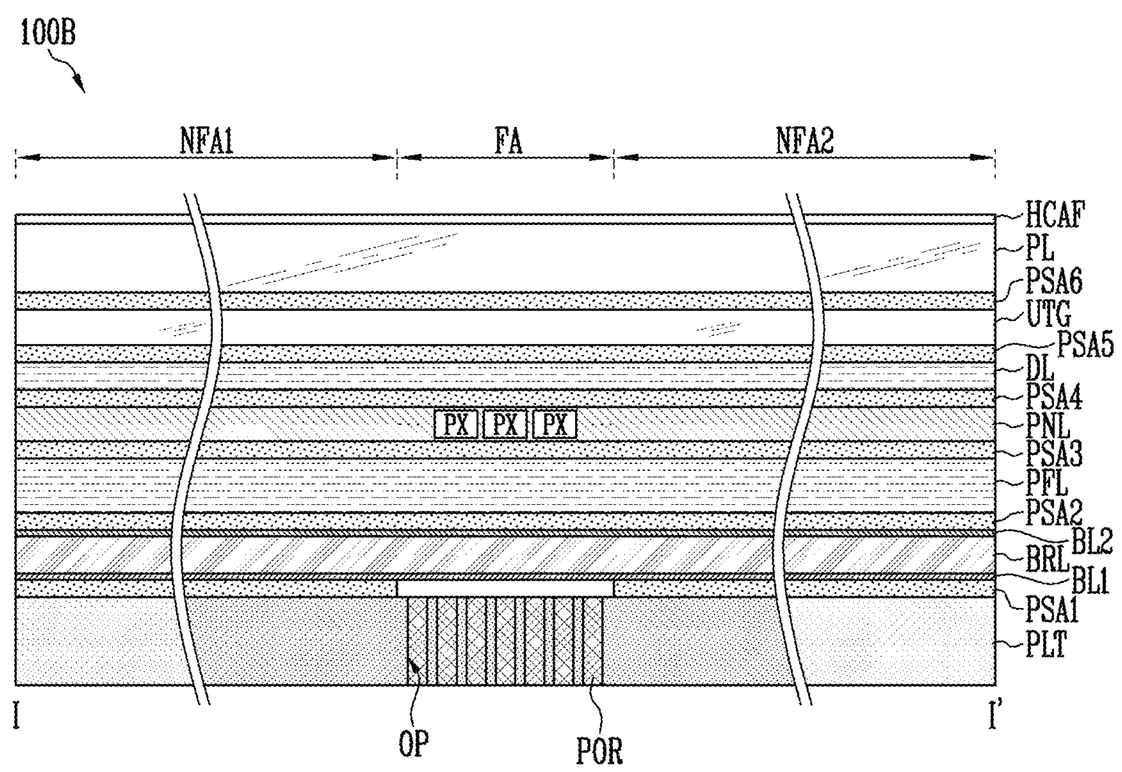
FIG. 4 is a sectional view taken along the line I-I' in accordance with a second embodiment of the display device shown in FIG. 1.

FIG. 4 is a sectional view taken along the line I-I' in accordance with a second embodiment of the display device shown in FIG. 1.

Referring to FIG. 4, a display device 100B in accordance with the second embodiment of the present disclosure may be substantially identical to the display device 100A in accordance with the first embodiment of the present disclosure, which has been described with reference to FIG. 3. Therefore, duplicate descriptions of components described above with reference to FIG. 3 may be omitted from the following description of FIG. 4.

A first adhesive layer PSA1 in the display device 100B differs from the first adhesive layer PSA1 in the display device 100A. In the display device 100B in accordance with the second embodiment of the present disclosure, the first adhesive layer PSA1 may overlap with the unfoldable areas NFA1 and NFA2 and may not overlap with the foldable area FA.

As the first adhesive layer PSA1 does not overlap with the foldable area FA, the display module DM and the plate PLT may be spaced apart from each other in the foldable area FA, and a gap may reside in the folding area FA between the display module DM and the plate PLT. That is, a portion of the plate PLT defining the plurality of opening patterns OP in the foldable area FA may be spaced apart from an overlying portion of the display module DM. Although a shape of the display device 100B may be repetitively deformed in the foldable area FA or the display device 100B may be subject to impact applied from the outside the display device 100B, the display module DM and the portion of the plate PLT defining the plurality of opening patterns OP may not be substantially in contact with each other. Accordingly, rugged patterns corresponding to the plurality opening patterns OP can be prevented from being formed in or imprinted into the display module DM.

Figure 5:
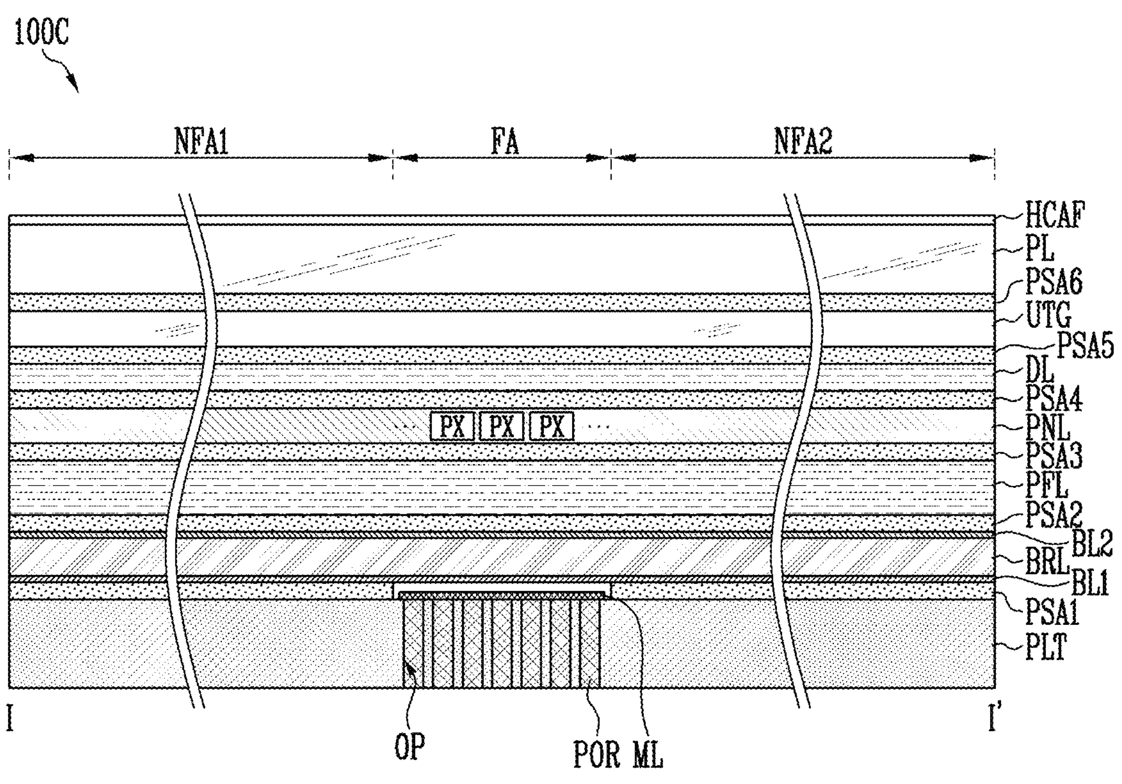
FIG. 5 is a sectional view taken along the line I-I' in accordance with a third embodiment of the display device shown in FIG. 1.

FIG. 5 is a sectional view taken along the line I-I' in accordance with a third embodiment of the display device shown in FIG. 1.

Referring to FIG. 5, a display device 100C in accordance with the third embodiment of the present disclosure may be substantially identical to the display device 100B in accordance with the second embodiment of the present disclosure, which has been described with reference to FIG. 4. Therefore, duplicate descriptions of components shown in FIG. 5 but already described above may be omitted hereinafter.

The display device 100C differs from the display device 100B in that the display device 100C further includes a step difference compensation layer SCL. In the display device 100C in accordance with the third embodiment of the present disclosure, the step difference compensation layer SCL may be disposed on the plate PLT in the foldable area FA and may cover the polyolefin-based resin POR filling the plurality of opening patterns OP.

The step difference compensation layer SCL may at least partially compensate for a step difference under the display module DM caused by the first adhesive layer PSA1 being missing from the foldable area FA on the plate PLT. Specifically, if a portion of the display module DM overlapping the step difference sags, the step difference compensation layer SCL may support the sagging portion of the display module DM. Accordingly, sagging may be controlled and limited, and generation of creases due to the sagging of the display module DM in the foldable area FA can be effectively prevented.

In an embodiment, the step difference compensation layer SCL may include a metal layer ML. The step difference compensation layer SCL may have a single-layer structure including the metal layer ML. The metal layer ML may include, for example, aluminum.

Figure 6:
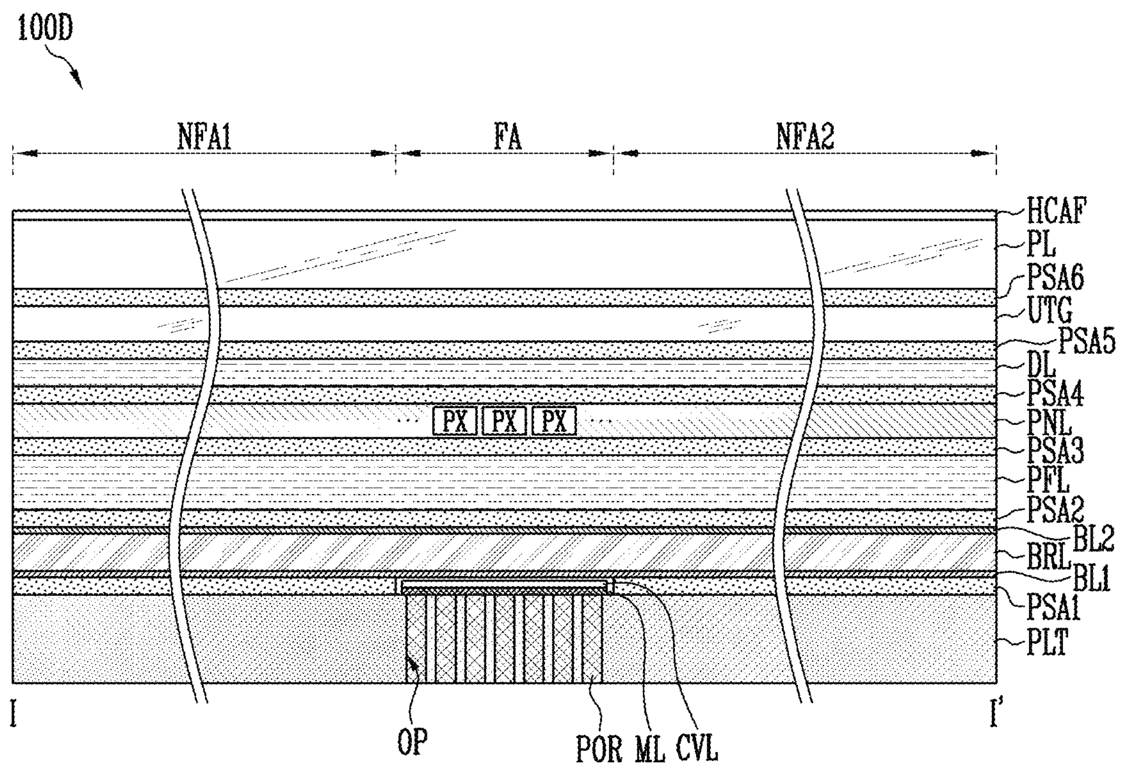
FIG. 6 is a sectional view taken along the line I-I' in accordance with a fourth embodiment of the display device shown in FIG. 1.

FIG. 6 is a sectional view taken along the line I-I' in accordance with a fourth embodiment of the display device shown in FIG. 1.

Referring to FIG. 6, a display device 100D in accordance with the fourth embodiment of the present disclosure may be substantially identical to the display device 100C in accordance with the third embodiment of the present disclosure, which has been described with reference to FIG. 5. Therefore, duplicate descriptions of components already described above may be omitted hereinafter.

The display device 100D differs from the display device 100C in that the step difference compensation layer SCL in the display device 100D further includes a cover layer CVL. In the embodiment of FIG. 6, the step difference compensation layer SCL may include the metal layer ML and the cover layer CVL on the metal layer ML. The cover layer CVL may increase the thickness of the step difference compensation layer SCL and may be made of a material that improves the ability of the step difference compensation layer SCL to support the display module DM. Accordingly, the step difference compensation layer SCL can more effectively compensate for the step difference that results because the first adhesive layer PSA1 does not overlap with the foldable area FA on the plate PLT.

Figure 7:
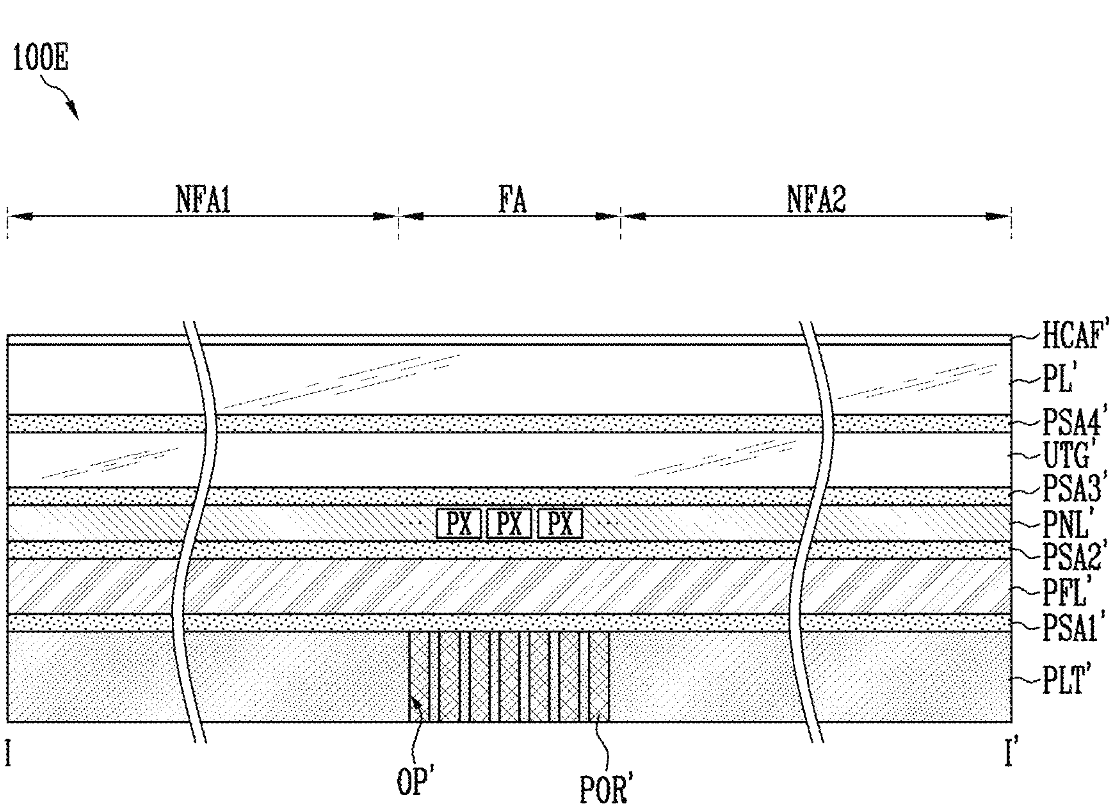
FIG. 7 is a sectional view taken along the line I-I' in accordance with a fifth embodiment of the display device shown in FIG. 1.

FIG. 7 is a sectional view taken along the line I-I' in accordance with a fifth embodiment of the display device shown in FIG. 1.

Referring to FIG. 7, a display device 100E in accordance with the fifth embodiment of the present disclosure may include a plate PLT', a first adhesive layer PSA1', a protective film layer PFL', a second adhesive layer PSA2', a panel layer PNL', a third adhesive layer PSA3', a glass layer UTG', a fourth adhesive layer PSA4', a first protective layer PL', and a second protective layer HCAF'. The protective film layer PFL', the second adhesive layer PSA2', and the panel layer PNL' may form a display module DM', and the glass layer UTG', the fourth adhesive layer PSA4', the first protective layer PL', and the second protective layer HCAF' may form a window WD'.

The plate PLT' may include a material having a relatively high hardness. Accordingly, the plate PLT' may function to support various components disposed on the plate PLT'. For example, the plate PLT' may function to support the display module DM' under the display module DM'.

In an embodiment, the plate PLT' may define a plurality of opening patterns OP' overlapping with the foldable area FA. Accordingly, the plate PLT' in the foldable area FA may be more flexible than the plate PLT' is in the first unfoldable area NFA1 and the second unfoldable area NFA2.

The first adhesive layer PSA1' may be interposed between the plate PLT' and the display module DM'. For example, the first adhesive layer PSA1' may be interposed between the plate PLT' and the protective film layer PFL' as shown in FIG. 7. The first adhesive layer PSA1' may adhere the plate PLT' and the display module DM' to each other.

In an embodiment, the first adhesive layer PSA1' may be in direct contact with each of the plate PLT' and the display module DM'. For example, as shown in FIG. 7, the first adhesive layer PSA1' may be in direct contact with the plate PLT' and the protective film layer PFL'.

The protective film layer PFL' may be on the first adhesive layer PSA1'. The protective film layer PFL' may be under the panel layer PNL' and may absorb and reduce the effect of impacts on the bottom of the panel layer PNL'. Also, the protective film layer PFL' may also block an impurity infiltrating toward a bottom surface of the panel layer PNL'.

The panel layer PNL' may be on the protective film layer PFL', and the second adhesive layer PSA2' may be interposed between the protective film layer PFL' and the panel layer PNL'.

The panel layer PNL' may include a plurality of pixels PX. Each of the plurality of pixels PX may emit light, and the display device 100E may display an image formed by a combination of the light emitted from the plurality of pixels PX.

The second adhesive layer PSA2' may adhere the protective film layer PFL' and the panel layer PNL' to each other. In an embodiment, the second adhesive layer PSA2' may be in direct contact with each of the protective film layer PFL' and the panel layer PNL'.

The glass layer UTG' may be disposed on the panel layer PNL', and the third adhesive layer PSA3' may be interposed between the glass layer UTG' and the panel layer PNL'.

The glass layer UTG' may include a material having a relatively high light transmittance and a relatively high hardness. Also, the glass layer UTG' may be flexible. For example, the glass layer UTG' may include an ultra-thin reinforcing glass.

The third adhesive layer PSA3' may adhere the panel layer PNL' and the glass layer UTG' to each other. In an embodiment, the third adhesive layer PSA3' may be in direct contact with each of the panel layer PNL' and the glass layer UTG'.

The first protective layer PL' may be disposed on the glass layer UTG', and the fourth adhesive layer PSA4' may be in direct contact with each of the glass layer UTG' and the first protective layer PL'.

The first protective layer PL' may have a relatively high light transmittance and may include a material having a sufficient hardness to protect underlying structures. Also, the first protective layer PL' may be flexible. For example, the first protective layer PL' may include polyethylene terephthalate (PET). The first protective layer PL' may protect the display device 100E from external impact.

The fourth adhesive layer PSA4' may adhere the glass layer UTG' and the first protective layer PL' to each other. In an embodiment, the fourth adhesive layer PSA4' may be in direct contact with each of the glass layer UTG' and the first protective layer PL'.

The second protective layer HCAF' may be disposed on the first protective layer PL'. In an embodiment, the second protective layer HCAF' may be a coating layer coated on the first protective layer PL'. The second protective layer HCAF' may prevent or resist formation of a trace (e.g., a fingerprint or the like) caused by a touch of a user.

The above-described display device 100E in accordance with the fifth embodiment of the present disclosure may be one in which lacks some components that are in the display device 100A in accordance with the first embodiment of the present disclosure, which has been described with reference to FIG. 3. For example, the display device 100E does not include the barrier layer BRL, the first black primer coating layer BL1, the second block primer coating layer BL2, the functional layer DL, and the like, which have been described with reference to FIG. 3. Accordingly, the display device 100E may have a thickness in the third direction DR3 that is thinner than the thickness of the display device 100A. For example, in the display device 100E, a thickness of the display module DM' in the third direction DR3 may be about 80 μm or more and about 120 μm or less.

A thickness of the glass layer UTG' in the third direction DR3, which is included in the display device 100E in accordance with the fifth embodiment of the present disclosure, may be thicker than a thickness of the glass layer UTG included in the display device 100A in accordance with the first embodiment of the present disclosure. Accordingly, the glass layer UTG' included in the display device 100E can more effectively protect the display device 100E from external impact.

Although the glass layer UTG' in the display device 100E may be a relatively thick as described above, a total thickness of the display device 100E may still be thinner than a total thickness of the display device 100A. That is, the display device 100E in accordance with the fifth embodiment of the present disclosure can secure a sufficient thickness of the glass layer UTG' while the total thickness maintains a relatively low level.

In the above-described display device 100E in accordance with the fifth embodiment of the present disclosure, a polyolefin-based resin POR' may fill the plurality of opening patterns OP' defined in the plate PLT'. The polyolefin-based resin POR' may improve the reliability of the plate PLT' in the foldable area FA. Specifically, if the polyolefin-based resin POR' was omitted, repetitive shape deformation in the foldable area FA may cause the plate PLT' to sag in a direction opposite to the third direction DR3 in the foldable area FA. Accordingly, the display module DM' may also sag in the foldable area FA, creating a problem in that creases may be generated in the display device 100E. In the present disclosure, as the polyolefin-based resin POR' is disposed to fill the plurality of opening patterns OP', sagging of the plate PLT' in the foldable area FA can be minimized.

In an embodiment, a melting point of the polyolefin-based resin POR' may be about 100° C. or higher and about 180° C. or lower, preferably, about 130° C. or higher and about 150° C. or lower. When the melting point of the polyolefin-based resin POR' is in the above-described temperature ranges, the reliability of the polyolefin-based resin POR' can be maintained even through the temperature of the display device 100E is increased by an operation of the display device 100E. In addition, the temperature required in a process of forming the polyolefin-based resin POR', which will be described later, can be relatively low, and thus manufacturing efficiency may be improved.

In an embodiment, the polyolefin-based resin POR' may be a linear low density polyethylene (LLDPE) resin including a repeating unit derived from ethylene and a repeating unit derived from C3 to C8 alpha-olefin. More specifically, the linear low density polyethylene (LLDPE) resin may be made of polymer having a main chain including a repeating unit derived from ethylene and a repeating unit derived from C3 to C8 alpha-olefin and a C2 to C6, preferably, C2 to C3 side chain, and the linear low density polyethylene (LLDPE) resin have a density of about 0.915 g/cm$^3$ or more and about 0.935 g/cm$^3$ or less. The linear low density polyethylene (LLDPE) resin may have a relatively lower density than does a high density polyethylene (HDPE) resins (i.e., having density of about 0.94 g/cm$^3$ or more and about 0.966 g/cm$^3$ or less), and the linear low density polyethylene (LLDPE) resin may be more linear than low density polyethylene (LDPE) resins (i.e., resins made of polymer with a cross-linking structure and/or a C7 or more side chain). Various kinds of resins previously known in the art may be used as the linear low density polyethylene (LLDPE) resin without limitation. The linear low density polyethylene (LLDPE) resin may provide tensile strength, elongation, impact strength, moisture-proof performance, heat resistance, and stress resistance, which are excellent when compared with the high density polyethylene (HDPE) resins and low density polyethylene (LDPE) resins. Thus, the polyolefin-based resin POR' can sufficiently ensure reliability in spite of the repetitive shape deformation in the foldable area FA.

In an embodiment, the first adhesive layer PSA1' may overlap with the first unfoldable area NFA1 and the second unfoldable area NFA2. Also, the first adhesive layer PSA1' may overlap with the foldable area FA. That is, the first adhesive layer PSA1' may entirely cover the first unfoldable area NFA1, the foldable area FA, and the second unfoldable area NFA2.

The first adhesive layer PSA1' may cover polyolefin-based resin POR' filling the plurality of opening patterns OP' in the foldable area FA. That is, no empty space may be between the plate PLT' and the display module DM' in the foldable area FA. Accordingly, the display module DM' may be sufficiently supported in the foldable area FA to minimize generation of creases in the foldable area FA and an area adjacent thereto in spite of the repetitive shape deformation of the display device 100.

Figure 8:
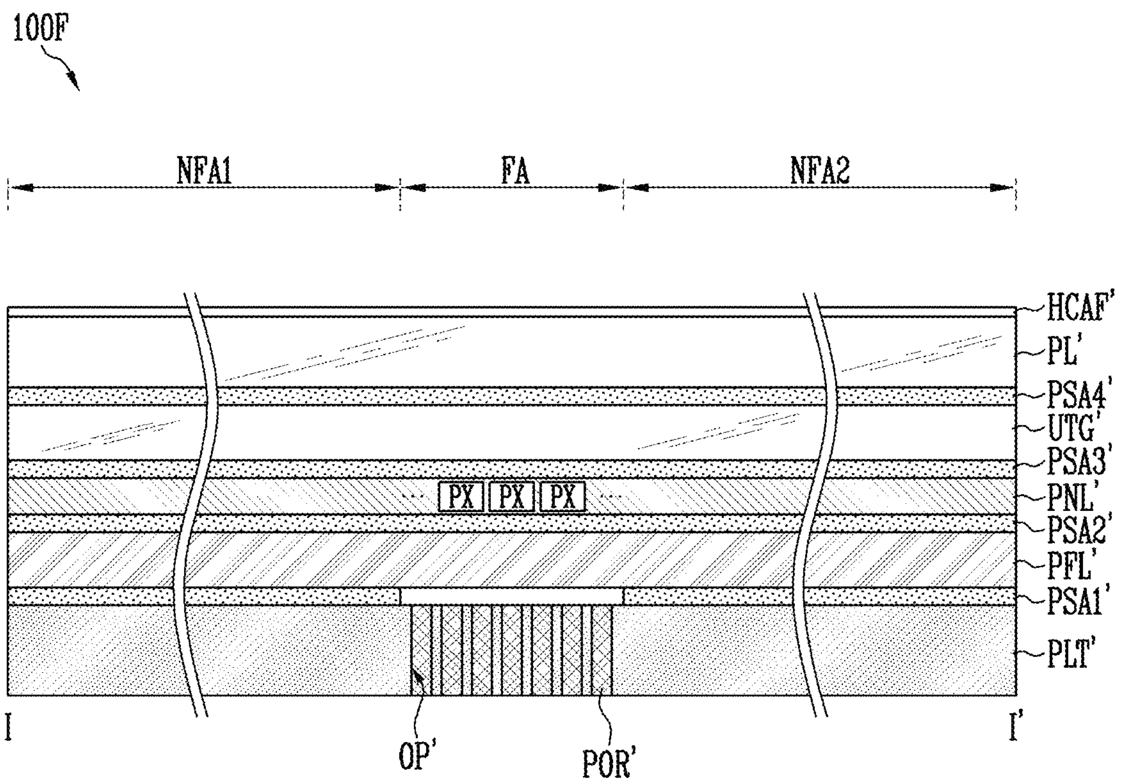
FIG. 8 is a sectional view taken along the line I-I' in accordance with a sixth embodiment of the display device shown in FIG. 1.

FIG. 8 is a sectional view taken along the line I-I' in accordance with a sixth embodiment of the display device shown in FIG. 1.

Referring to FIG. 8, a display device 100F in accordance with the sixth embodiment of the present disclosure may be substantially identical to the display device 100E in accordance with the fifth embodiment of the present disclosure, which has been described with reference to FIG. 7. Therefore, duplicate descriptions of components shown in FIG. 8 that are already described above may be omitted below.

The first adhesive layer PSA1' in the display device 100F differs from the first adhesive layer PSA1' in the display device 100E. In the display device 100F, the first adhesive layer PSA1' may overlap with the unfoldable areas NFA1 and NFA2 and may not overlap with the foldable area FA. As the first adhesive layer PSA1' does not overlap with the foldable area FA, the display module DM' and the plate PLT' may be spaced apart from each other in the foldable area FA. That is, a portion of the plate PLT' defining the plurality of opening patterns OP' in the foldable area FA may be spaced apart from an overlying portion of the display module DM'. Although a shape of the display device 100F may be repetitively deformed in the foldable area FA or may be externally impacted, the display module DM' and the portion of the plate PLT' defining the plurality of opening patterns OP' may not substantially contact each other. Accordingly, rugged patterns corresponding to the plurality opening patterns OP' can be prevented from being formed in the display module DM'.

Figure 9:
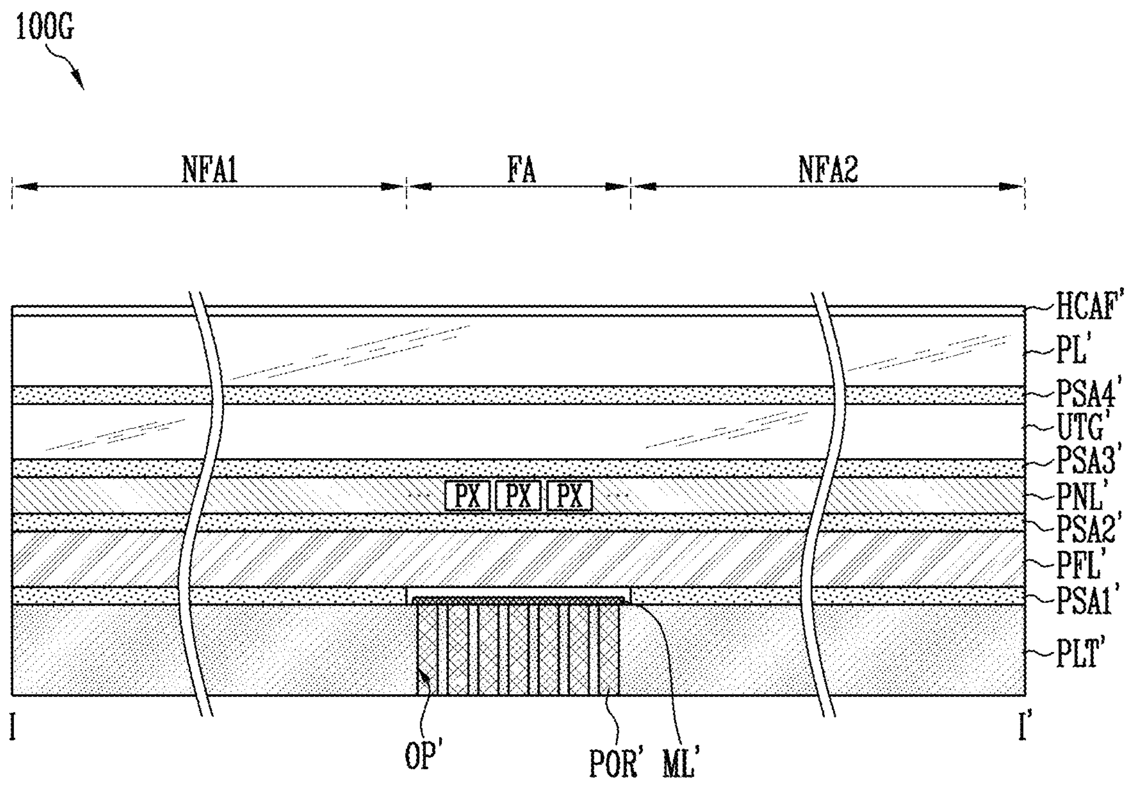
FIG. 9 is a sectional view taken along the line I-I' in accordance with a seventh embodiment of the display device shown in FIG. 1.

FIG. 9 is a sectional view taken along the line I-I' in accordance with a seventh embodiment of the display device shown in FIG. 1.

Referring to FIG. 9, a display device 100G in accordance with the seventh embodiment of the present disclosure may be substantially identical to the display device 100F in accordance with the sixth embodiment of the present disclosure, which has been described with reference to FIG. 8. Therefore, duplicate descriptions of components shown in FIG. 9 that are the same as those described above may be omitted below.

The display device 100G differs from the display device 100F in that the display device 100G includes a step difference compensation layer SCL'. In the display device 100G, the step difference compensation layer SCL' may be on the plate PLT' in the foldable area FA and may cover the polyolefin-based resin POR' filling the plurality of opening patterns OP'.

The step difference compensation layer SCL' may compensate for a step difference where the first adhesive layer PSA1' does not overlap with the foldable area FA on the plate PLT'. If a portion of the display module DM' overlapping with the step difference sags, the step difference compensation layer SCL' may support the sagging portion of the display module DM'. Accordingly, generation of creases due to the sagging of the display module DM' may be effectively prevented.

In an embodiment, the step difference compensation layer SCL' may include a metal layer ML'. The step difference compensation layer SCL' may have a single-layer structure including the metal layer ML'. The metal layer ML' may include, for example, aluminum.

Figure 10:
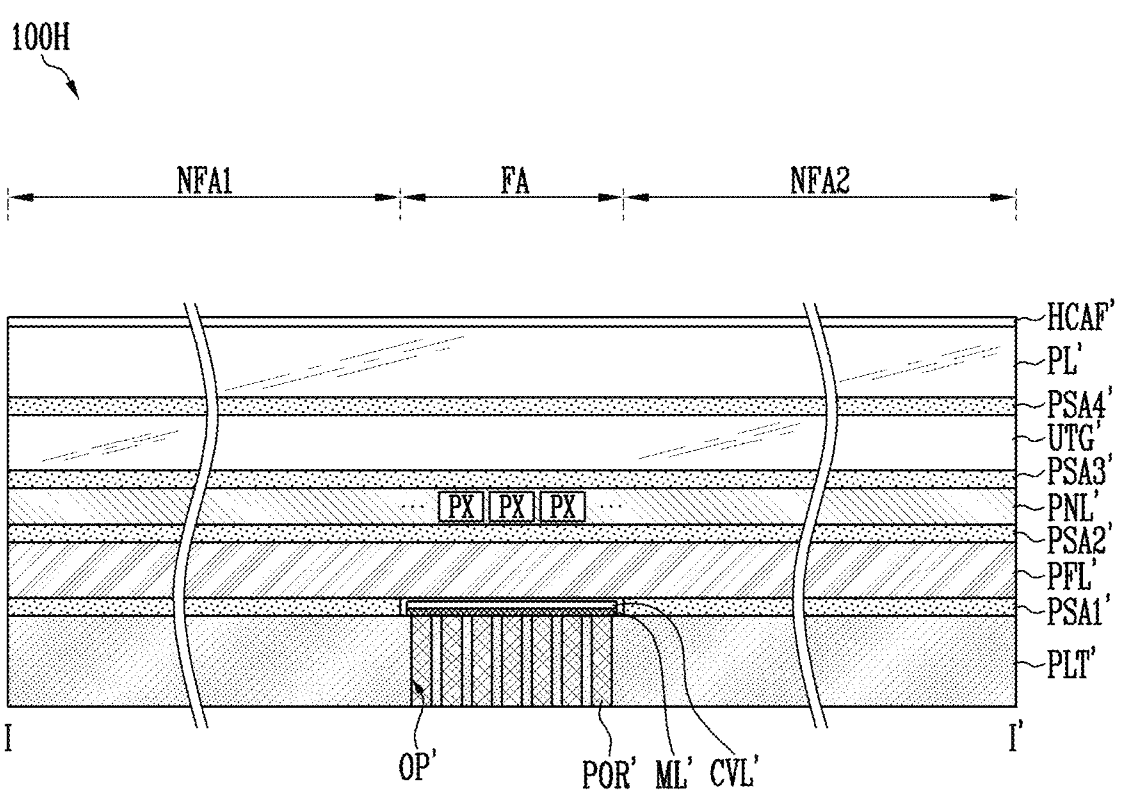
FIG. 10 is a sectional view taken along the line I-I' in accordance with an eighth embodiment of the display device shown in FIG. 1.

FIG. 10 is a sectional view taken along the line I-I' in accordance with an eighth embodiment of the display device shown in FIG. 1.

Referring to FIG. 10, a display device 100H in accordance with the eighth embodiment of the present disclosure may be substantially identical to the display device 100G in accordance with the seventh embodiment of the present disclosure, which has been described with reference to FIG. 9. Components shown in FIG. 9 have been described above. Therefore, descriptions of components shown in FIG. 10 that are the same as those described above may be omitted below.

The display device 100H differs from the display device 100G in that the step difference compensation layer SCL' in the display device 100H further includes a cover layer CVL'. In the display device 100H, the step difference compensation layer SCL' may include the metal layer ML' and the cover layer CVL' disposed on the metal layer ML'. Accordingly, the step difference compensation layer SCL' can more effectively compensate for the step difference that results from the first adhesive layer PSA1' not overlapping with the foldable area FA on the plate PLT'.

Figure 11:
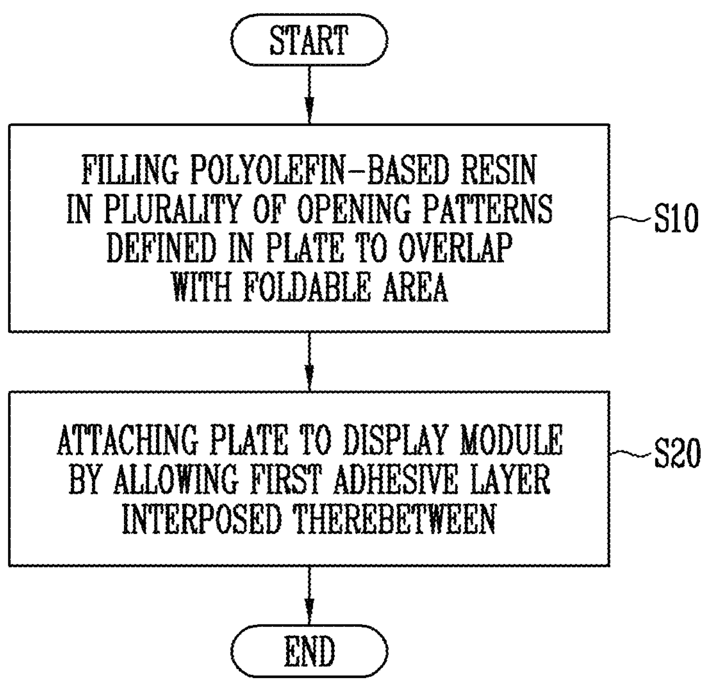
FIG. 11 is a flow diagram illustrating a method of manufacturing the display device shown in FIG. 1.

FIG. 11 is a flow diagram illustrating a method of manufacturing a display device in accordance with any of the embodiments described above.

Referring to FIG. 11, the method of manufacturing the display device may include a step S10 that fills a polyolefin-based resin in a plurality of opening patterns defined in an area of a plate to overlap with a foldable area and a step S20 that attaches the plate to a display module using a first adhesive layer interposed between the plate and the display module.

Figure 12:
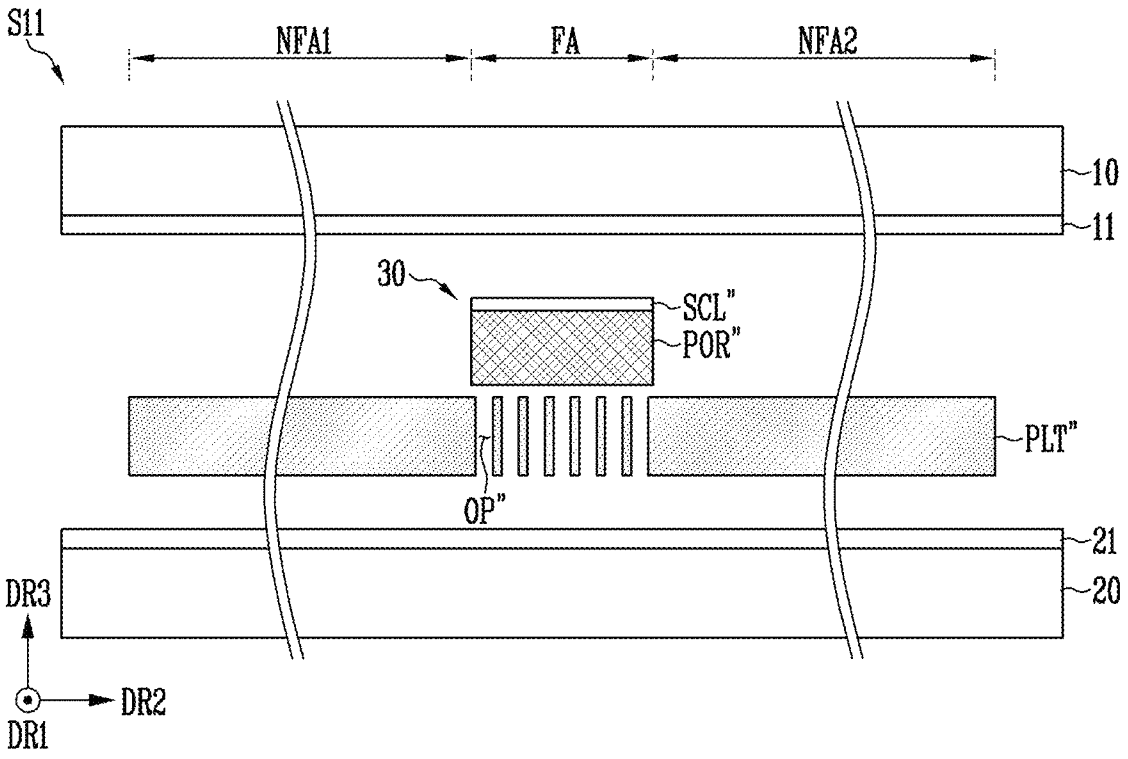
FIGS. 12, 13, and 14 are sectional views illustrating heating and pressing step shown in FIG. 11.
Figure 13:
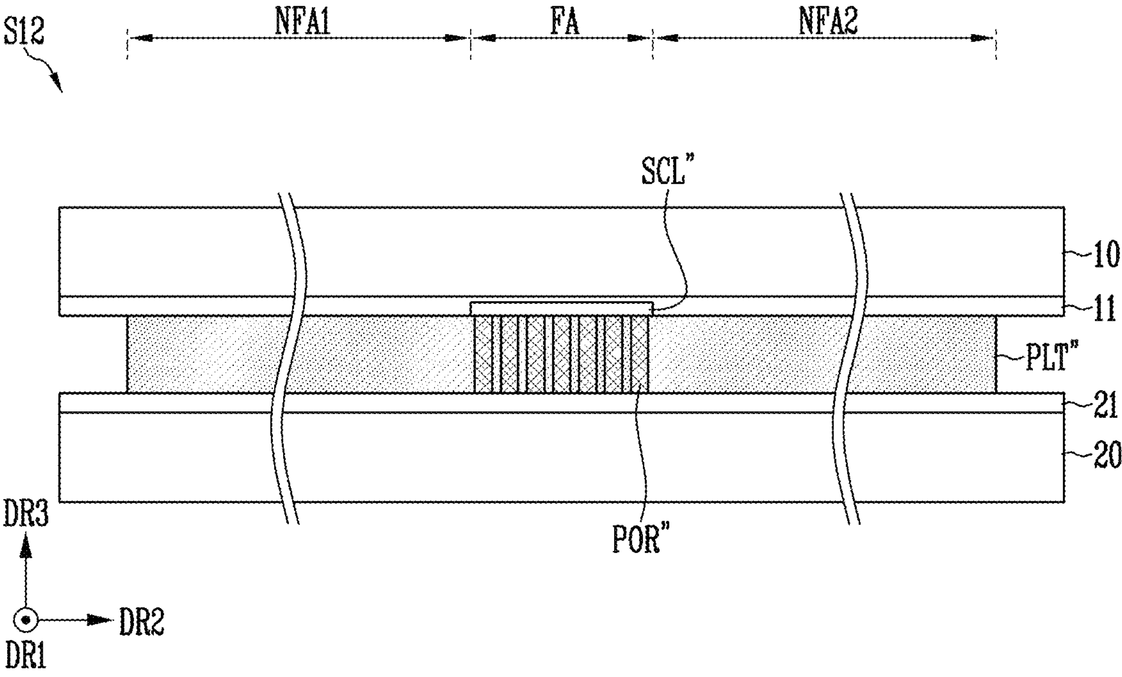
Figure 14:
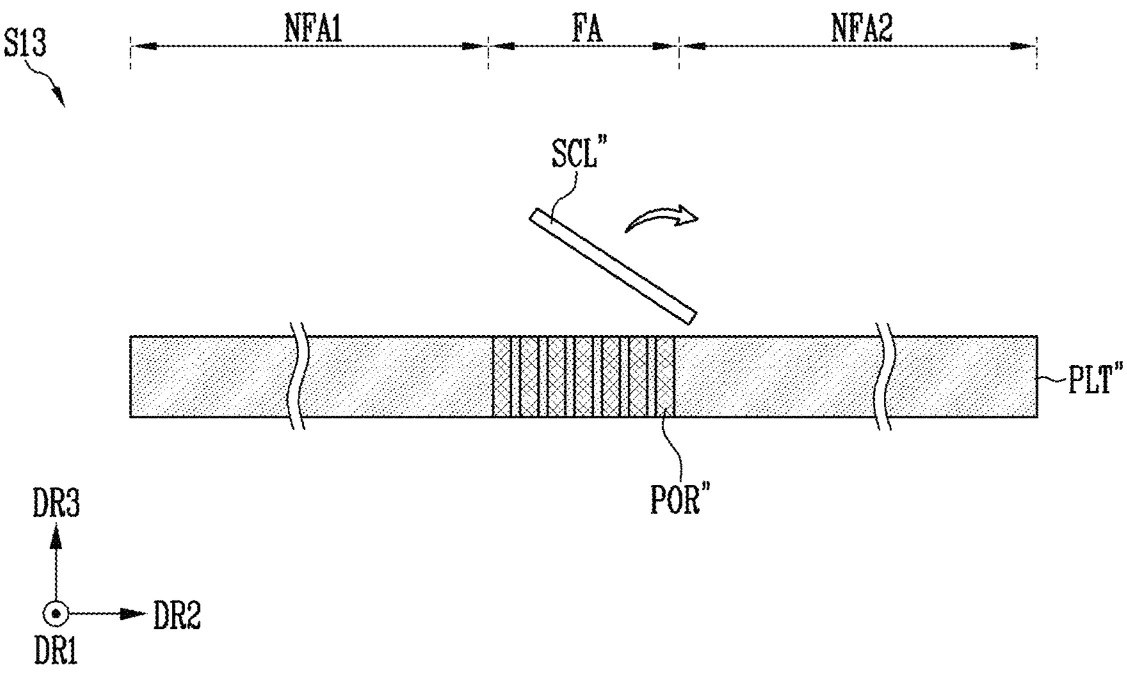

FIGS. 12 to 14 are sectional views illustrating an embodiment of the step S10 shown in FIG. 11.

FIG. 12 illustrates a process S11 during which a structure 30 including a polyolefin-based resin POR" and a step difference compensation layer SCL" may be placed on a plate PLT". The plate PLT", the polyolefin-based resin POR", and the step difference compensation layer SCL" may be used to form any one of the plates PLT and PLT', any one of the polyolefin-based resins POR and POR', and any one of the step difference compensation layers SCL and SCL', which have been described with reference to FIGS. 3 to 10.

The plate PLT" and the structure 30 may be disposed between a first pressurizing plate 10 and a second pressurizing plate 20. A first release film layer 11 may be attached to a surface of the first pressurizing plate 10, which faces the plate PLT" and the structure, and a second release film layer 21 may be attached to a surface of the second pressurizing plate 20, which faces the plate PLT" and the structure.

In addition, the structure 30 may be disposed such that the polyolefin-based resin PRO" is adjacent to the plate PLT" and closer to the plate PLT" than is the step difference compensation layer SCL". The structure 30 may be sized and positioned to overlap with the foldable area FA and not to overlap with the unfoldable areas NFA1 and NFA2.

FIG. 13 illustrates a process S12 during which the structure 30 and the plate PLT" may be heated and pressed together using the first pressurizing plate 10 and the second pressurizing plate 20. For example, the first pressurizing plate 10 may be moved toward the second pressurizing plate 20. At this time, the polyolefin-based resin POR" may be softened or melted, and the applied pressure may cause the polyolefin-based resin POR" to fill a plurality of opening patterns OP" defined in the plate PLT". The step different compensation layer SCL" may not melt and may be disposed on the plate PLT" to cover the polyolefin-based resin POR" filling the plurality of opening patterns OP".

The heating and pressing may be performed at a temperature equal to or higher than a melting point of the polyolefin-based resin POR". For example, when the melting point of the polyolefin-based resin POR" is about 100° C. or higher and about 180° C. or lower as described above, the heating and pressing may be performed at a temperature equal to or higher than the melting point of the polyolefin-based resin POR"

FIG. 14 illustrates a process S13 during which the step difference compensation layer SCL" may be removed. The process S13 may only be needed for some of the embodiments described above. For example, when the display device 100A, 100B, 100E, or 100F, which has been described with reference to FIG. 3, 4, 7, or 8, is manufactured, the step S13 of removing the step difference compensation layer SCL" may be performed. Alternatively, when the display device 100C, 100D, 100G, or 100H, which has been described with reference to FIG. 5, 6, 9, or 10, is manufactured, the step S13 of removing the step difference compensation layer SCL" may not be performed.

In accordance with the present disclosure, a display device may include a polyolefin-based resin filling a plurality of opening patterns defined in a plate. Thus, the supporting force that the plate applies in a display device can be improved, and accordingly, the display device may avoid or better resist formation of crease.

In a method of manufacturing a display device in accordance with the present disclosure, generation of creases can be substantially prevented.

Example embodiments have been disclosed herein, and although specific terms are employed, they are used and are to be interpreted in a generic and descriptive sense only and not for the purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments. Accordingly, it will be understood by those of skill in the art that various changes in form and details disclosed herein may be made without departing from the spirit and scope of the present disclosure as set forth in the following claims.

What is claimed is:

1. A display device including unfoldable areas and a foldable area disposed between the unfoldable areas, the display device comprising:
- a display module;
- a plate supporting the display module under the display module, the plate defining a plurality of opening patterns overlapping with the foldable area;
- a first adhesive layer interposed between the display module and the plate; and
- a polyolefin-based resin filling the plurality of opening patterns;
- wherein the polyolefin-based resin is a linear low density polyethylene (LLDPE) resin including a repeating unit derived from ethylene and a repeating unit derived from C3 to C8 alpha-olefin.

2. The display device of claim 1, wherein a melting point of the polyolefin-based resin is 100° C. or higher and 180° C. or lower.

3. The display device of claim 1, wherein the first adhesive layer overlaps the unfoldable areas and does not overlap the foldable area.

4. The display device of claim 3, further comprising a step difference compensation layer that is on the plate in the foldable area and covers the polyolefin-based resin filling the plurality of opening patterns.

5. The display device of claim 4, wherein the step difference compensation layer includes a metal layer and a cover layer disposed on the metal layer.

6. The display device of claim 1, wherein the display module includes:
- a protective film layer;
- a panel layer disposed on the protective film layer, the panel layer including a plurality of pixels; and
- a second adhesive layer interposed between the protective film layer and the panel layer.

7. The display device of claim 6, wherein the first adhesive layer is in direct contact with each of the protective film layer and the plate in the unfoldable area.

8. The display device of claim 6, wherein a thickness of the display module is 80 μm or more and 120 μm or less.

9. The display device of claim 1, wherein the first adhesive layer overlaps the unfoldable areas and the foldable area.

10. A method of manufacturing a display device including unfoldable areas and a foldable area disposed between the unfoldable areas, the method comprising:
- filling a polyolefin-based resin in a plurality of opening patterns defined in a plate to overlap with the foldable area; and
- attaching the plate to a display module using a first adhesive layer interposed therebetween,
- wherein the filling comprises pressing together the plate and a structure including the polyolefin-based resin and a step difference compensation layer disposed on the polyolefin-based resin, the pressing using a pair of pressurizing plates,
- wherein the polyolefin-based resin is a linear low density polyethylene (LLDPE) resin including a repeating unit derived from ethylene and a repeating unit derived from C3 to C8 alpha-olefin.

11. The method of claim 10, wherein during the pressing, the structure does not overlap the unfoldable area and does overlap the foldable area.

12. The method of claim 10, further comprising removing the step difference compensation layer after pressing together the plate and structure.

13. The method of claim 10, wherein a melting point of the polyolefin-based resin is 100° C. or higher and 180° C. or lower.

14. The method of claim 10, wherein the pressing is performed at a temperature equal to or higher than the melting point of the polyolefin-based resin.

15. A display device including unfoldable areas and a foldable area disposed between the unfoldable areas, the display device comprising:
- a display module;
- a plate supporting the display module under the display module, the plate defining a plurality of opening patterns overlapping with the foldable area;
- a first adhesive layer interposed between the display module and the plate and disposed to overlaps the unfoldable areas and without overlapping the foldable area;
- a polyolefin-based resin filling the plurality of opening patterns; and
- a step difference compensation layer that is on the plate in the foldable area and covers the polyolefin-based resin filling the plurality of opening patterns;

wherein the step difference compensation layer includes a metal layer and a cover layer disposed on the metal layer.

* * * * *